(12) United States Patent
Nagano et al.

(10) Patent No.: US 9,299,627 B2
(45) Date of Patent: Mar. 29, 2016

(54) SEMICONDUCTOR PACKAGE HAVING A CAP UNIT WITH CONCAVE PORTION AND METHOD OF MANUFACTURING THE SAME

(71) Applicant: Kabushiki Kaisha Toshiba, Minato-ku (JP)

(72) Inventors: Toshihiko Nagano, Aichi (JP); Tadahiro Sasaki, Tokyo (JP); Kazuhide Abe, Kanagawa (JP); Hiroshi Yamada, Kanagawa (JP); Kazuhiko Itaya, Kanagawa (JP); Taihei Nakada, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/166,189

(22) Filed: Jan. 28, 2014

(65) Prior Publication Data

US 2014/0210066 A1     Jul. 31, 2014

(30) Foreign Application Priority Data

Jan. 30, 2013  (JP) ................................. 2013-015438

(51) Int. Cl.
*H01L 23/04* (2006.01)
*H01L 23/48* (2006.01)
(Continued)

(52) U.S. Cl.
CPC ................ *H01L 23/13* (2013.01); *H01L 23/04* (2013.01); *H01L 23/147* (2013.01);
(Continued)

(58) Field of Classification Search
CPC ......... H01L 23/13; H01L 24/97; H01L 23/66; H01L 23/147; H01L 23/49822; H01L 23/04; H01L 23/5389; H01L 23/49827; H01L 2224/0401; H01L 2223/6683; H01L 2223/6616; H01L 2224/8185; H01L 2224/13294; H01L 2924/142; H01L 2224/81444; H01L 2224/13315; H01L 24/81; H01L 2224/08235; H01L 2224/133; H01L 24/08; H01L 2924/16196; H01L 2224/81193; H01L 2924/1615; H01L 2224/80895; H01L 2224/1329; H01L 2224/131; H01L 2224/13144; H01L 24/16; H01L 2224/81815; H01L 24/80; H01L 2924/15159; H01L 2224/97; H01L 2924/1423; H01L 2224/81205; H01L 2224/13111; H01L 24/13; H01L 2924/1461

USPC ......... 257/698, 773, 774, 730, 731, 733, 712, 257/713

See application file for complete search history.

(56) References Cited

U.S. PATENT DOCUMENTS

2008/0042227 A1   2/2008  Asano et al.
2008/0246136 A1*  10/2008 Haba et al. .................... 257/686

(Continued)

FOREIGN PATENT DOCUMENTS

CN    101675516 A    3/2010
JP    3917649        5/2007

(Continued)

OTHER PUBLICATIONS

Combined Office Action and Search Report issued Apr. 30, 2015 in Taiwanese Patent Application No. 103100962 (with English language translation).

*Primary Examiner* — A. Sefer
*Assistant Examiner* — Dilinh Nguyen
(74) *Attorney, Agent, or Firm* — Oblon, McClelland, Maier & Neustadt, L.L.P.

(57) ABSTRACT

A semiconductor package of an embodiment includes: a semiconductor chip having a signal input terminal and a signal output terminal; and a cap unit that is formed on the semiconductor chip. The cap unit includes a concave portion forming a hollow structure between the semiconductor chip and the cap unit, a first through electrode electrically connected to the signal input terminal, and a second through electrode electrically connected to the signal output terminal. Of the inner side surfaces of the concave portion, a first inner side surface and a second inner side surface facing each other are not parallel to each other.

9 Claims, 12 Drawing Sheets

(51) Int. Cl.
*H01L 23/52* (2006.01)
*H01L 29/40* (2006.01)
*H01L 23/34* (2006.01)
*H01L 23/13* (2006.01)
*H01L 23/14* (2006.01)
*H01L 23/498* (2006.01)
*H01L 23/538* (2006.01)
*H01L 23/66* (2006.01)
*H01L 23/00* (2006.01)

(52) U.S. Cl.
CPC ... *H01L 23/49822* (2013.01); *H01L 23/49827* (2013.01); *H01L 23/5389* (2013.01); *H01L 23/66* (2013.01); *H01L 24/97* (2013.01); *H01L 24/08* (2013.01); *H01L 24/13* (2013.01); *H01L 24/16* (2013.01); *H01L 24/80* (2013.01); *H01L 24/81* (2013.01); *H01L 2223/6616* (2013.01); *H01L 2223/6683* (2013.01); *H01L 2224/0401* (2013.01); *H01L 2224/08235* (2013.01); *H01L 2224/131* (2013.01); *H01L 2224/133* (2013.01); *H01L 2224/1329* (2013.01); *H01L 2224/13111* (2013.01); *H01L 2224/13144* (2013.01); *H01L 2224/13294* (2013.01); *H01L 2224/13344* (2013.01); *H01L 2224/16235* (2013.01); *H01L 2224/80895* (2013.01); *H01L 2224/8185* (2013.01); *H01L 2224/81193* (2013.01); *H01L 2224/81205* (2013.01); *H01L 2224/81444* (2013.01); *H01L 2224/81815* (2013.01); *H01L 2224/97* (2013.01); *H01L 2924/142* (2013.01); *H01L 2924/1423* (2013.01); *H01L 2924/1461* (2013.01); *H01L 2924/15159* (2013.01); *H01L 2924/1615* (2013.01); *H01L 2924/16196* (2013.01)

(56) References Cited

U.S. PATENT DOCUMENTS

2012/0013415 A1* 1/2012 Tange .................... 331/158
2012/0018772 A1   1/2012 Nishijima et al.

FOREIGN PATENT DOCUMENTS

| TW | 201140887 A1 | 11/2011 |
| TW | 201222743 A1 | 6/2012 |
| WO | WO 2008/108970 A2 | 9/2008 |

* cited by examiner

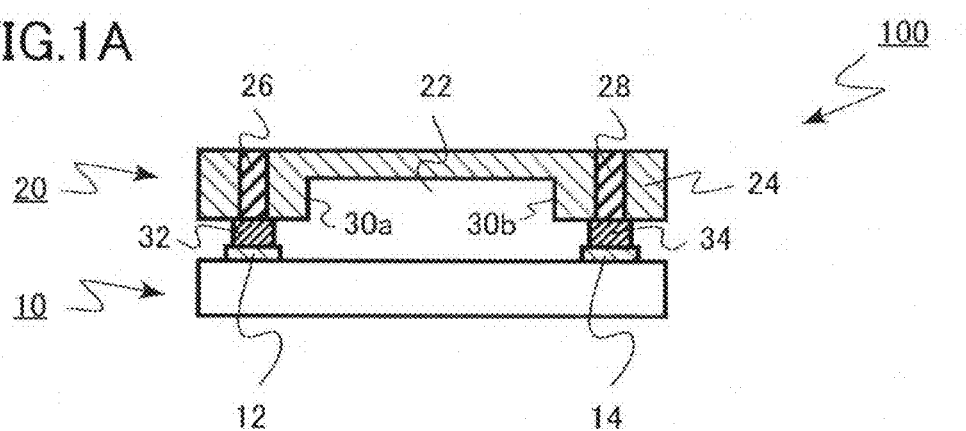
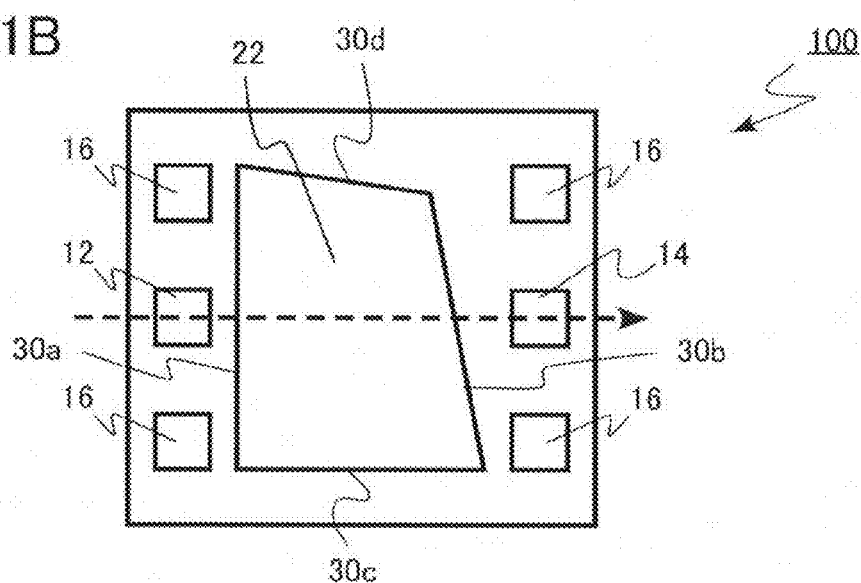

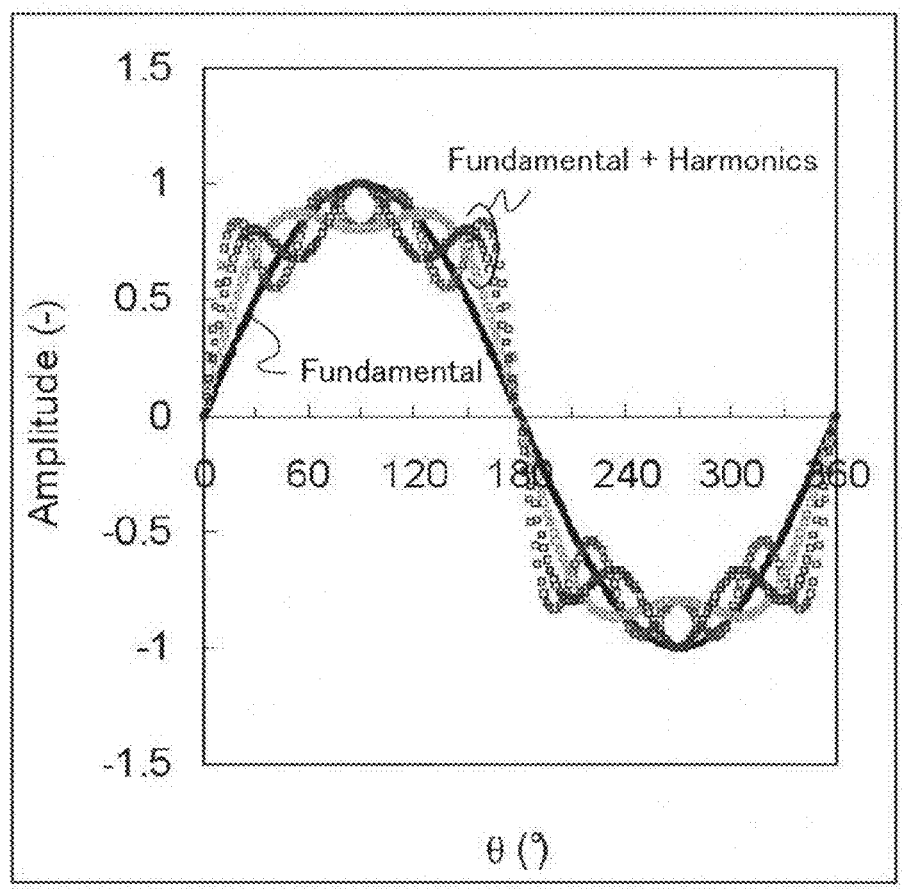

US 9,299,627 B2

SEMICONDUCTOR PACKAGE HAVING A CAP UNIT WITH CONCAVE PORTION AND METHOD OF MANUFACTURING THE SAME

CROSS-REFERENCE TO RELATED APPLICATION

This application is based upon and claims the benefit of priority from Japanese Patent Application No. 2013-015438, filed on Jan. 30, 2013, the entire contents of which are incorporated herein by reference.

FIELD

Embodiments described herein relate generally to a semiconductor package and a method of manufacturing the semiconductor package.

BACKGROUND

To satisfy the demand for more sophisticated electronic devices, each device chip needs to be smaller in size and have more functions. Not only that, a superior additional value should be provided through a combination of applications based on integration of chips having different functions from one another. In a case where a new application is added to a wireless communication device, for example, forming one chip that includes an analog processing circuit for wireless communications and a digital circuit for signal processing is considered effective. To realize this, various requirements in design specifications are expected to be fulfilled particularly in the field of development of packages for device chips and in the general mounting technology in a later stage.

Particularly, when a high-frequency semiconductor chip or a power semiconductor chip is mounted, there exist a large number of requirements for mounting technology, since the strength of signals to pass is high (several W or higher), frequency is high (several GHz or higher), or electrical impedance matching and an insertion loss reduction are necessary. Therefore, there are many problems with design and processing in forming packages and forming modules in later stages.

Those conventionally used structures are manufactured as modules by inserting individual semiconductor chips into a package material that is a metal, a ceramic material, or a combination of those materials, and mounting the semiconductor chips, together with another element such as a passive component, on a printed board or the like. For example, a high-frequency chip called an MMIC (Monolithic Microwave Integrated Circuit) needs to achieve both electrical impedance matching at the input/output unit and a reduction in insertion loss of electrical signals. To realize that, a high-frequency chip is die-bonded to a package material formed with a metal, a ceramic material, or a combination of those materials by using a material such as Au or Au(Sn), and is then wire-bonded with an Au wire or the like. The high-frequency chip is hermetically sealed therein, and is completed as one package. Those components are then mounted, together with a capacitor, an inductor, a resistor, and the like, on a printed board by using soldering, wire bonding, and the like. In this manner, a high-frequency module is completed as a system.

The frequencies to be handled in a high-frequency semiconductor chip range over several digits, and various degrees of power pass through such a semiconductor chip. Therefore, it is necessary to select a package and a mounting method suitable for circumstances of use. Also, in a case where semiconductor chips having different functions are formed into one package or module, there is a demand for novel mounting technology that can form a package without a large ceramic package, so as to reduce package sizes and achieve a higher degree of integration.

In a high-frequency device, the existence of frequencies other than the frequency (such as the carrier frequency) to be subjected to signal processing often adversely affects the signal processing. This is due to the existence of frequencies called harmonics (frequencies equal to integral multiples of fundamental). In signal processing based on wireless communication technology, frequencies that are equal to odd multiples of fundamental are particularly expected to be restrained.

Therefore, in designing high-frequency devices, restraints on harmonics are often taken into account from the beginning. For example, an element is formed by combining an open stub, a short stub, an inductor, a capacitor, and the like in a semiconductor chip, so as to restrain harmonics.

However, when those semiconductor chips are mounted on a ceramic package, a printed board, or the like, further generation of harmonics due to parasitic components or the like resulting from the mounting system becomes a problem. In addition to that, in a signal processing circuit using an amplifier, oscillation of frequencies of harmonics might occur.

Therefore, there is a demand for a structure that restrains generation of harmonics due to parasitic components or the like in mounting semiconductor chips.

BRIEF DESCRIPTION OF THE DRAWINGS

FIGS. 1A and 1B are schematic views of a semiconductor package of a first embodiment;

FIG. 3 is a graph showing signal waveforms observed in a case where harmonics are generated;

DETAILED DESCRIPTION

Figure 2A:
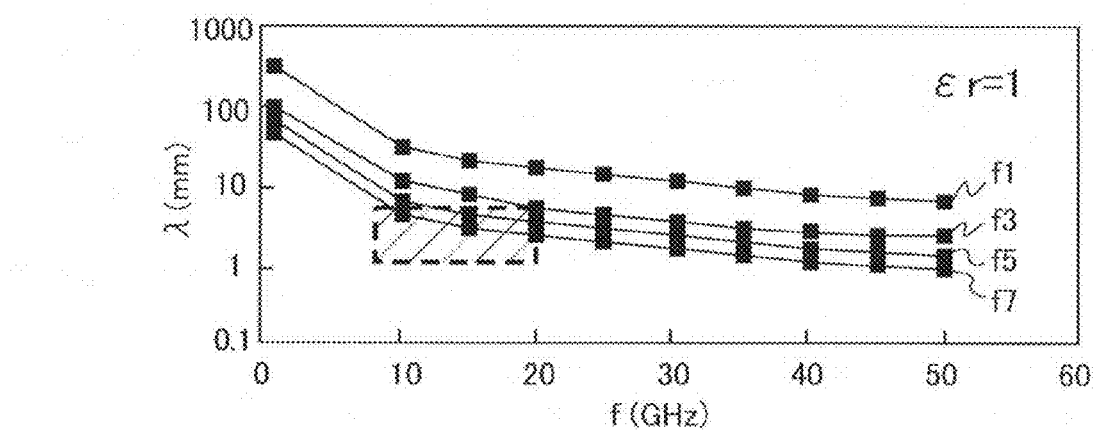
FIGS. 2A and 2B are graphs showing relationships among wavelengths of carrier frequencies and harmonics, and sizes of semiconductor packages.

A semiconductor package of an embodiment includes: a semiconductor chip having a signal input terminal and a signal output terminal; and a cap unit that is formed on the semiconductor chip, and includes a concave portion forming a hollow structure between the semiconductor chip and the cap unit, a first through electrode electrically connected to the input terminal, the first through electrode penetrating through the cap unit, and a second through electrode electrically connected to the output terminal, the second through electrode penetrating through the cap unit. Of the inner side surfaces of the concave portion, a first inner side surface and a second inner side surface facing each other are not parallel to each other.

(First Embodiment)

FIGS. 1A and 1B are schematic views of a semiconductor package of this embodiment. FIG. 1A is a cross-sectional view, and FIG. 1B is a top view.

In the semiconductor package 100, a semiconductor chip 10 is packaged. The semiconductor chip 10 may be a high-frequency semiconductor chip that processes signals in a microwave band of several GHz, such as an MMIC (Monolithic Microwave Integrated Circuit).

The semiconductor chip 10 has a signal input terminal 12 and a signal output terminal 14 on a surface thereof. The semiconductor chip 10 also has ground terminals 16 on the surface thereof. The signal input terminal 12, the signal output terminal 14, and the ground terminals 16 are metal pad electrodes, for example.

In the semiconductor package 100, a cap unit 20 is provided on the semiconductor chip 10. In the cap unit 20, a concave portion 22 forming a hollow structure (void) between the semiconductor chip 10 and the cap unit 20 is provided.

The cap unit 20 is formed by processing a cap material 24. The cap material 24 may be a metal, a semiconductor, a resin, an oxide, or a combination of those materials. In view of processing through a semiconductor manufacturing process, at least part of the cap material 24 is preferably a semiconductor such as silicon (Si).

Also, the cap material 24 is preferably a high-resistance material with a resistivity of 100 Ωcm or higher, so as to reduce insertion loss in the semiconductor chip 10. For example, the cap material 24 is formed with high-resistance silicon.

In the cap unit 20, a first through electrode 26 to be electrically connected to the signal input terminal 12, and a second through electrode 28 to be electrically connected to the signal output terminal 14 are provided and penetrate through the cap material 24 forming the cap unit 20. Other than those electrodes, through electrodes to be electrically connected to the ground terminals 16 may be provided.

At least part of the first and second through electrodes 26 and 28 is preferably made of copper (Cu), a copper alloy, or the like, so as to reduce electrical resistance. It is possible to use some other metal material.

Barrier metal layers (not shown) for preventing oxidation may be provided on the end faces of the first and second through electrodes 26 and 28. The barrier metal layers each have a stack structure of nickel (Ni) and gold (Au), for example.

The signal input terminal 12 and the first through electrode 26 are electrically connected by a first connecting unit 32. Also, the signal output terminal 14 and the second through electrode 28 are electrically connected by a second connecting unit 34. The first and second connecting units 32 and 34 are made of an electrically conductive material. The electrically conductive material may be low-melting-point solder, for example.

The region other than the first and second connecting units 32 and 34 between the semiconductor chip 10 and the cap unit 20 may be a void or may be sealed with resin or the like.

The inner side surfaces of the concave portion 22 of the cap unit 20 are formed with an A surface 30a, a B surface 30b, a C surface 30c, and a D surface 30d. Of the inner side surfaces, the A surface (the first inner side surface) 30a and the B surface (the second inner side surface) 30b facing each other are not parallel to each other. That is, the A surface 30a and the B surface 30b are oblique to each other.

The A surface 30a and the B surface 30b are surfaces that are located in the direction of signal propagation indicated by the arrow with a dashed line in the semiconductor chip in FIG. 1B, or are surfaces that are located in the direction of electromagnetic wave propagation. In other words, the A surface 30a and the B surface 30b are surfaces intersecting the direction of signal propagation.

The direction of signal propagation in a semiconductor chip is uniquely determined by the circuit configuration of the semiconductor chip. In the semiconductor chip 10 of this embodiment, the direction of signal propagation is the direction from the signal input terminal 12 toward the signal output terminal 14 of the semiconductor chip 10, as shown in FIG. 1B.

Further, of the inner side surface sides in this embodiment, the C surface 30c and the D surface 30d facing each other are not parallel to each other, either. That is, the C surface 30c and the D surface 30d are oblique to each other.

The C surface 30c and the D surface 30d are surfaces that are located in the normal direction of the direction of signal propagation indicated by the arrow with a dashed line in the semiconductor chip in FIG. 1B, and are located in a direction parallel to the surface of the semiconductor chip 10.

Next, the functions and effects of the semiconductor package of this embodiment are described.

Figure 2B:
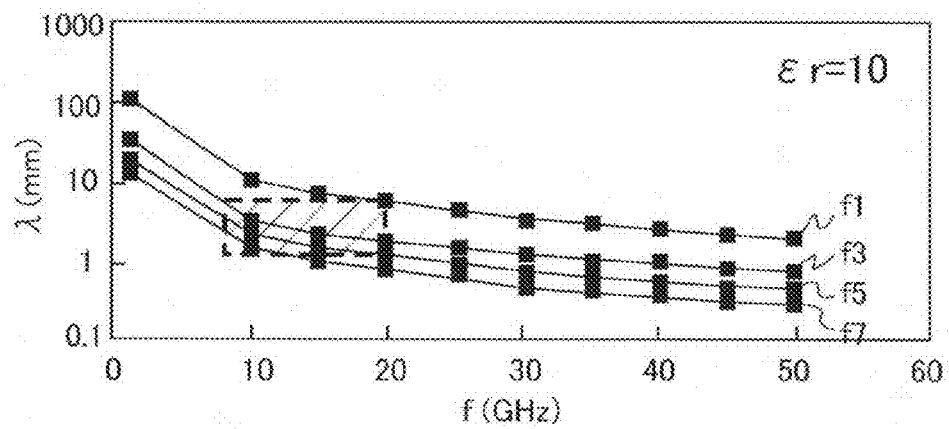

FIGS. 2A and 2B are graphs showing relationships among wavelengths of carrier frequencies and harmonics, and sizes of semiconductor packages. FIG. 2A illustrates a case where the dielectric constant (∈r) of the matter surrounding the semiconductor chip is 1 as in the case of the air, for example.

FIG. 2B illustrates a case where the dielectric constant (∈r) of the matter surrounding the semiconductor chip is 10, for example.

The graphs show fundamental (f1), third-order harmonics (f3), fifth-order harmonics (f5), and seventh-order harmonics (f7).

The shaded regions in dashed-line frames each indicate the size of the semiconductor package, or the size of the housing of the semiconductor package. As shown in the graphs, when the wavelength of the electromagnetic wave to be subjected to signal processing becomes closer to the size of the housing, standing waves at a frequency integral multiple times higher than the carrier frequency are generated in the housing, and as a result, harmonics are generated.

FIG. 3 is a graph showing signal waveforms observed in a case where harmonics are generated. As harmonics are superimposed on the fundamental of sine waves indicated by the solid line, distorted waveforms are observed. As a result, the quality of a signal to propagate is adversely affected.

Particularly, in a microwave band in which fundamental is at several GHz or higher, the chip size and the housing size are often at the same level as the wavelength, and the wavelength might become shorter than the size of the housing, depending on the dielectric constant of the matter surrounding the semiconductor chip.

In such a frequency range, there is a high possibility of harmonic increases. Therefore, it is necessary to take measures to reduce amplitude increases in harmonics.

First, in this embodiment, a ceramic package or a printed board is not used, and the semiconductor chip 10 is designed as a chip scale package having a hollow structure with the cap unit 20. Accordingly, the hollow structure contains gaseous matter having the dielectric constant of 1, such as the air. Thus, generation of harmonics is restrained even in a microwave band where fundamental is at several GHz or higher.

However, even if a hollow structure is formed, there is a possibility that standing waves are generated by reflection of electromagnetic waves from the inner side surfaces of the hollow structure, and harmonics are then generated.

Particularly, when the value of the wavelength of electromagnetic waves becomes closer to the value of the distance between two surfaces facing each other, generation of standing waves having a wavelength that is ½ or ¼ of the wavelength of the electromagnetic waves is facilitated.

In this embodiment, of the inner side surfaces, the A surface 30a and the B surface 30b facing each other are not parallel to each other, as described above. That is, the A surface 30a and the B surface 30b are oblique to each other.

In this embodiment, the distance between the A surface 30a and the B surface 30b facing each other is not fixed to one value. Accordingly, generation of standing waves resulting from reflection of electromagnetic waves between the two surfaces is restrained. Even if standing waves are generated, amplitude increases can be restrained.

Thus, generation of harmonics resulting from the hollow structure can be restrained. In this manner, a sophisticated semiconductor package that outputs signals with stable waveforms can be realized.

Particularly, the surfaces located in the direction of signal propagation greatly contribute to generation of standing waves resulting from high reflection of electromagnetic waves. Therefore, of the inner side surfaces of the concave portion, the first inner side surface and the second inner side surface that are located in the direction of signal propagation in the semiconductor chip and face each other are preferably not parallel to each other.

However, there are cases where the surfaces that are not located in the direction of signal propagation in the semiconductor chip 10, such as the C surface 30c and the D surface 30d shown in FIG. 1, contribute to generation of harmonics. Therefore, the two surfaces that are not located in the direction of signal propagation in the semiconductor chip 10 are preferably not parallel to each other, either, as in this embodiment.

Furthermore, in this embodiment, a semiconductor material that excels in processability, such as silicon, is used as the cap material 24, and accordingly, a size reduction and a cost reduction are realized. In this embodiment, excellent heat emission characteristics are also achieved, as the through electrodes made of a metal with high heat conductivity are provided in the cap unit.

(Second Embodiment)

A semiconductor package of this embodiment is the same as that of the first embodiment, except that, of the inner side surfaces of the concave portion, the first inner side surface has a first concave-convex pattern, and the second inner side surface has a second concave-convex pattern. Therefore, the same explanations as those in the first embodiment will not be repeated.

Figure 4A:
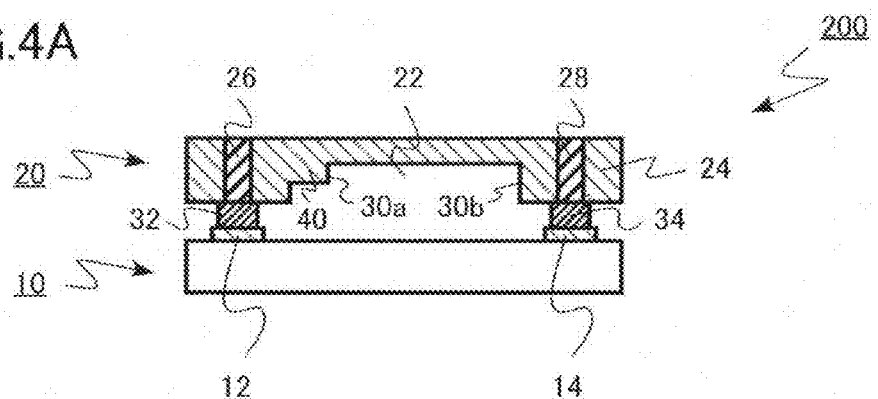
FIGS. 4A and 4B are schematic views of a semiconductor package of a second embodiment.
Figure 4B:
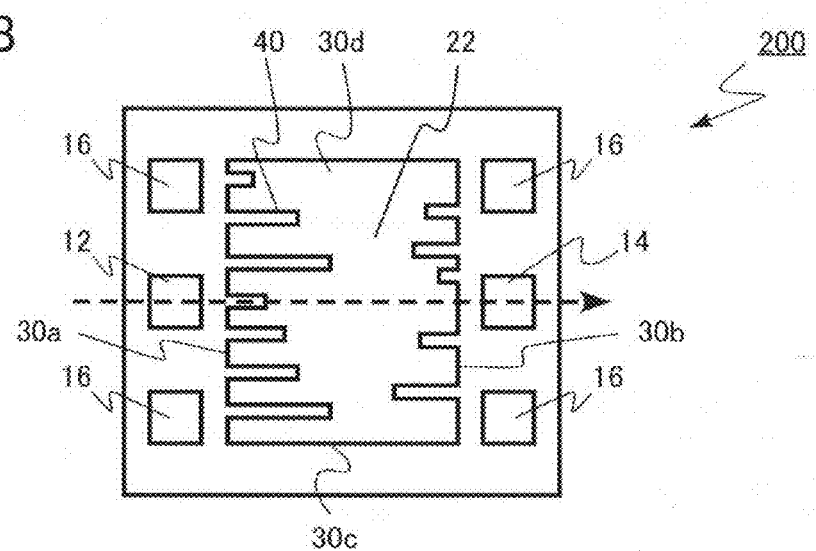

FIGS. 4A and 4B are schematic views of the semiconductor package of this embodiment. FIG. 4A is a cross-sectional view, and FIG. 4B is a top view.

The inner side surfaces of the concave portion 22 of the cap unit 20 of the semiconductor package 200 are formed with an A surface 30a, a B surface 30b, a C surface 30c, and a D surface 30d. Of the inner side surfaces, the A surface (the first inner side surface) 30a and the B surface (the second inner side surface) 30b facing each other are not parallel to each other. Both surfaces have concavities and convexities. The A surface 30a has a first concave-convex pattern, and the B surface 30b has a second concave-convex pattern.

The A surface 30a and the B surface 30b are surfaces that are located in the direction of signal propagation indicated by the arrow with a dashed line in the semiconductor chip in FIG. 4B, or are surfaces that are located in the direction of electromagnetic wave propagation. In other words, the A surface 30a and the B surface 30b are surfaces intersecting the direction of signal propagation.

Both the first concave-convex pattern and the second concave-convex pattern have protrusions 40 extending in the direction of signal propagation. The pattern of the protrusions 40 does not have any regularity. The first concave-convex pattern and the second concave-convex pattern differ from each other.

In this embodiment, the distance between the A surface 30a and the B surface 30b facing each other is varied as much as possible, so as to reduce generation of standing waves resulting from reflection of electromagnetic waves between the two surfaces, as in the first embodiment. Even if standing waves are generated, amplitude increases can be restrained.

Thus, generation of harmonics resulting from the hollow structure can be restrained. In this manner, a sophisticated semiconductor package that outputs signals with stable waveforms can be realized.

So as to restrain generation of standing waves by varying the distance between the A surface 30a and the B surface 30b facing each other with a greater degree of irregularity, the first concave-convex pattern and the second concave-convex pattern preferably have no regularity. However, if the distance between the A surface 30a and the B surface 30b is not fixed to one value, the first concave-convex pattern and the second concave-convex pattern may have regularity.

So as to restrain generation of standing waves by varying the distance between the A surface 30a and the B surface 30b facing each other with a greater degree of irregularity, the first concave-convex pattern and the second concave-convex pattern preferably differ from each other. However, if the distance between the A surface 30a and the B surface 30b is not fixed to one value, the first concave-convex pattern and the second concave-convex pattern may be the same patterns.

(Third Embodiment)

A semiconductor package of this embodiment is the same as that of the first embodiment, except that the first inner side surface has a first concave-convex pattern, the second inner side surface has a second concave-convex pattern, and the first concave-convex pattern and the second concave-convex pattern are random patterns with no regularity. Therefore, the same explanations as those in the first embodiment will not be repeated.

Figure 5A:
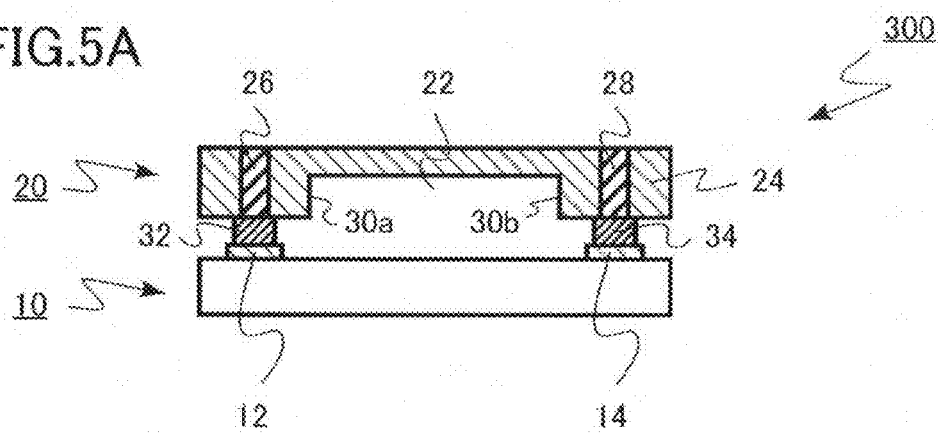
FIGS. 5A and 5B are schematic views of a semiconductor package of a third embodiment.
Figure 5B:
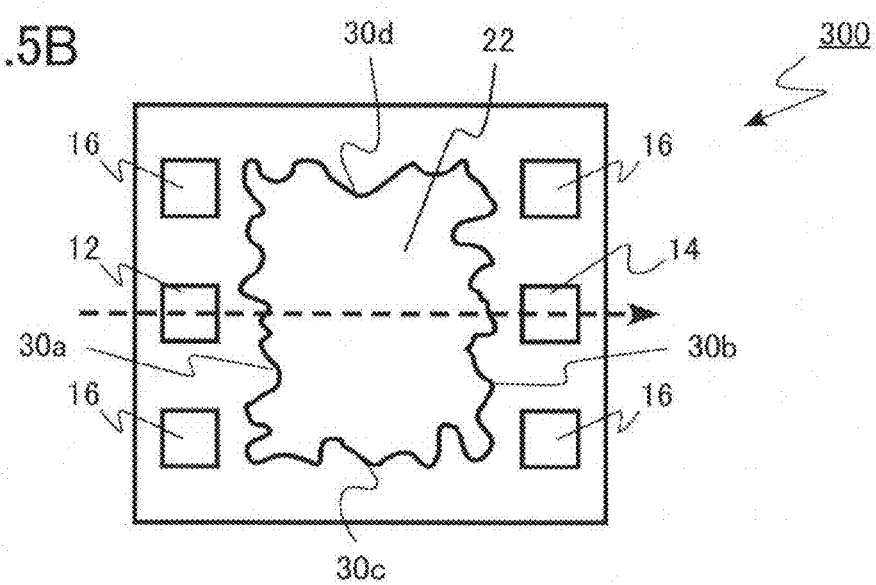

FIGS. 5A and 5B are schematic views of the semiconductor package of this embodiment. FIG. 5A is a cross-sectional view, and FIG. 5B is a top view.

The inner side surfaces of the concave portion 22 of the cap unit 20 are formed with an A surface 30a, a B surface 30b, a C surface 30c, and a D surface 30d. Of the inner side surfaces, the A surface (the first inner side surface) 30a and the B surface (the second inner side surface) 30b facing each other are not parallel to each other. The A surface 30a has a first concave-convex pattern, and the B surface 30b has a second concave-convex pattern.

The A surface 30a and the B surface 30b are surfaces that are located in the direction of signal propagation indicated by the arrow with a dashed line in the semiconductor chip in FIG. 5B, or are surfaces that are located in the direction of electromagnetic wave propagation. In other words, the A surface 30a and the B surface 30b are surfaces intersecting the direction of signal propagation.

The first concave-convex pattern and the second concave-convex pattern are random patterns.

In this embodiment, the C surface 30c and the D surface 30d facing each other are not parallel to each other, either. Both of the surfaces have a random pattern.

In this embodiment, the distance between the A surface 30a and the B surface 30b facing each other, and the distance between the C surface 30c and the D surface 30d facing each other are varied as much as possible, so as to restrain generation of standing waves resulting from reflection of electromagnetic waves between each two surfaces, as in the first embodiment. Even if standing waves are generated, amplitude increases can be restrained.

Thus, generation of harmonics resulting from the hollow structure can be restrained. In this manner, a sophisticated semiconductor package that outputs signals with stable waveforms can be realized.

(Fourth Embodiment)

A semiconductor package of this embodiment is the same as any of the first through third embodiments, except that one cap unit is provided on two different semiconductor chips, and the semiconductor package of this embodiment further includes an insulating layer formed on the cap unit, an interconnect layer that is formed on the insulating layer and is electrically connected to the signal input terminal or the signal output terminal, and a resin layer coating the two different semiconductor chips. Therefore, the same explanations as those in the first through third embodiments will not be repeated.

Figure 6:
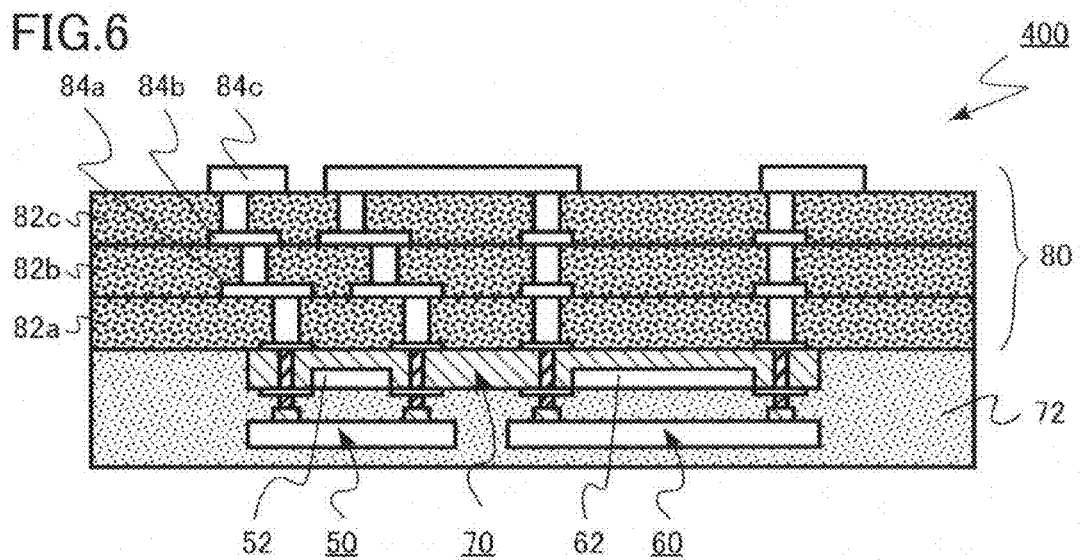
FIG. 6 is a schematic view of a semiconductor package of a fourth embodiment.

FIG. 6 is a schematic cross-sectional view of the semiconductor package of this embodiment.

In the semiconductor package 400, a first semiconductor chip 50 and a second semiconductor chip 60 are packaged. The first and second semiconductor chips 50 and 60 are high-frequency semiconductor chips that process signals of different frequency bands from each other, and may be MMICs, for example. An MMIC functions as a circuit that performs analog signal processing on microwave signals, for example.

In the semiconductor package 400, a cap unit 70 is provided on the first semiconductor chip 50 and the second semiconductor chip 60. In the cap unit 70, a concave portion 52 forming a hollow structure between the first semiconductor chip 50 and the cap unit 70 is provided. Also, in the cap unit 70, a concave portion 62 forming a hollow structure between the second semiconductor chip 60 and the cap unit 70 is provided.

Like the semiconductor chip of the first embodiment, the first semiconductor chip 50 and the second semiconductor chip 60 each have a signal input terminal and a signal output terminal on a surface thereof. Also, the two semiconductor chips each have ground terminals on the surface thereof.

The cap unit 70 also includes two pairs of a first through electrode and a second through electrode to be electrically connected to the respective signal input terminals and the respective signal output terminals of the first semiconductor chip 50 and the second semiconductor chip 60.

Of the inner side surfaces of each of the concave portions 52 and 62 of the cap unit 70, the first inner side surface and the second inner side surface facing each other are not parallel to each other, as in the first through third embodiments. The shapes of the inner side surfaces may vary between the first semiconductor chip 50 and the second semiconductor chip 60.

The first semiconductor chip 50 and the second semiconductor chip 60 are sealed with a resin layer 72. Three insulating layers 82a, 82b, and 82c, for example, are formed on the cap unit 70. Three interconnect layers 84a, 84b, and 84c to be electrically connected to the signal input terminals or the signal output terminals are provided on the three insulating layers 82a, 82b, and 82c, respectively, for example.

The three insulating layers 82a, 82b, and 82c, and the three interconnect layers 84a, 84b, and 84c constitute a multi-interconnect layer 80. This multi-interconnect layer 80 forms an input/output interconnect between the first semiconductor chip 50 and the second semiconductor chip 60, for example. Also, it is possible to establish an electrical connection with another semiconductor chip or a passive element (not shown) sealed with the same resin layer 72, for example.

The insulating layers 82a, 82b, and 82c are made of an insulating resin such as epoxy resin.

The interconnect layers 84a, 84b, and 84c are made of a metal, for example. The connections among the interconnect layers 84a, 84b, and 84c, and the connections between the interconnect layer 84a and the signal input terminals or the signal output terminals are formed by metal vias, for example.

In this embodiment, generation of harmonics resulting from the hollow structures in the cap unit can be restrained, as in the first through third embodiments. In this manner, a sophisticated semiconductor package that outputs signals with stable waveforms can be realized.

Furthermore, an input/output interconnect that adapts to impedance matching can be formed with the multi-interconnect layer 80. Also, as another semiconductor chip or a passive element is provided in the same resin layer 72 coating the first semiconductor chip 50 and the second semiconductor chip 60, a small-sized semiconductor package with a large number of functions can be realized.

Next, a method of manufacturing the semiconductor package of this embodiment is described. The method of manufacturing the semiconductor package of this embodiment includes: forming first and second through electrodes in a wafer; forming a concave portion in the wafer, the concave portion having inner side surfaces including a first inner side surface and a second inner side surface that face each other and are not parallel to each other; mounting a semiconductor chip on the wafer, the semiconductor chip having a signal input terminal and a signal output terminal on a surface thereof, the signal input terminal being electrically connected to the first through electrode via a first connecting unit having electrical conductivity, the signal output terminal being electrically connected to the second through electrode via a second connecting unit having electrical conductivity, a void being formed at least in one portion between the concave portion and the semiconductor chip; and dividing the semiconductor chip into individual chips by dicing the wafer on which the semiconductor chip is mounted.

FIGS. 7A through 7E are cross-sectional views showing the steps according to the method of manufacturing the semiconductor package of this embodiment.

Figure 7A:
FIGS. 7A through 7E are cross-sectional views showing the steps according to a method of manufacturing the semiconductor package of the fourth embodiment.

First, the formation of the cap unit is described. A high-resistance silicon wafer 90 is first prepared (FIG. 7A). The thickness of the wafer 90 is about 100 to 400 μm, for example.

Figure 7B:
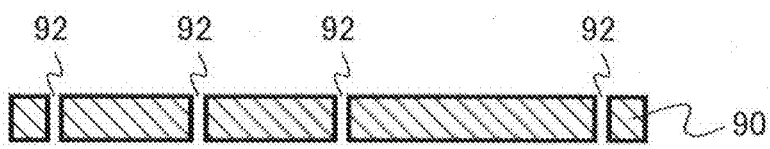

Through holes 92 for forming through electrodes are then formed in the high-resistance silicon wafer 90 (FIG. 7B). In forming the through holes 92, D-RIE (Deep Reactive Ion Etching) is used, for example. After patterning is performed on a resist by conventional photolithography, for example, a so-called Bosch process can be carried out to subject the wafer to plasma processing while alternately applying $SF_6$/$C_4F_8$ gases from a mass flow controller to a process chamber.

The resist and a fluoride passivation film are then removed from the high-resistance silicon wafer 90. After that, a 1-μm thermally-oxidized film (not shown) is formed on the entire wafer surface by a thermal oxidation furnace of a steam oxidation type. A seed layer (not shown) for providing copper plating is then formed. A 100-nm metal thin film (not shown) made of titanium (Ti) and a 100-nm metal thin film (not shown) made of copper (Cu) are formed in this order by a sputtering method on the high-resistance silicon wafer 90 having the through holes 92 formed therein.

The first and second through electrodes 26 and 28 are then formed by Cu electrolytic plating. A Cu plating layer of about 50 µm in surface thickness is formed by electrolytic plating using a cupric sulfate solution, and any extra Cu layer on the substrate surface is removed by mechanical grinding and through a lithography and etching process.

Figure 7C:
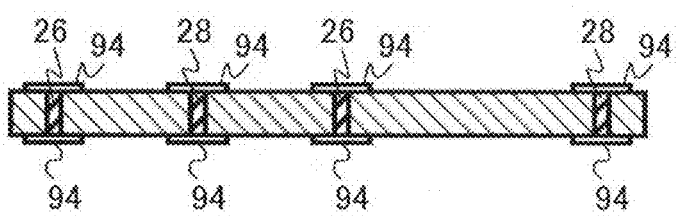

To prevent oxidation of the through Cu electrodes in the cap structure, an Ni layer of about 1 µm is formed by electrolytic or non-electrolytic plating prior to the formation of Au bumps, and an Au film of about 0.1 µm is further formed on the Ni layer by flash plating, to form a barrier metal layer 94 (FIG. 7C).

Figure 7D:
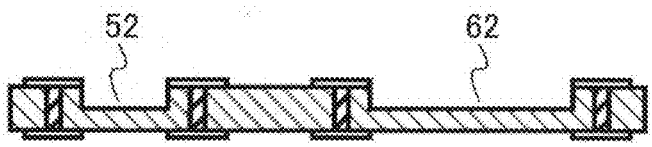

The concave portions 52 and 62 are then formed in the high-resistance silicon wafer 90 by lithography and RIE (FIG. 7D). Of the inner side surfaces of each of the concave portions 52 and 62, the first inner side surface and the second inner side surface facing each other are designed not to be parallel to each other. The depth of each concave portion is about 50 µm, for example.

The shapes of the first inner side surface and the second inner side surface may have any of the shapes described above in the first through third embodiments, for example. The pattern of the second embodiment having the protrusions 40 as shown in FIG. 4 can be formed by using two-stage D-RIE, for example.

In that case, the concave portion is formed halfway in terms of depth in the first step, and a lithography and etching process is performed to form two regions with different depths in the next step. In this manner, the concave portion including the first and second inner side surfaces that have the protrusions 40 can be formed.

Also, the shape of the first or third embodiment can be formed with a mask pattern at the time of DT-RIE, and the shape of the third embodiment can be formed by optimizing the etching conditions at the time of DT-RIE.

After that, Au bumps 96 are formed on the signal input terminals 12 and the signal output terminals 14 of the first and second semiconductor chips 50 and 60. The diameter and the height of the bumps 96 are determined by a request for control on junction heights in a later step. The height of the tops of the bumps 96 is set at about 50 µm, for example.

Figure 7E:
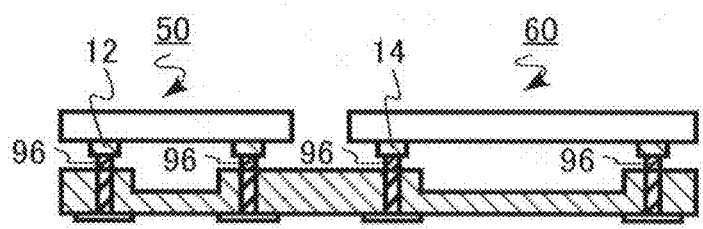

After that, an Au—Sn paste of about 20 µm in thickness is formed on the barrier metal layer 94, and the chip having the Au bumps 96 formed thereon is mounted with a mounter. Junctions are then formed at temperatures from 250° C. to 300° C. in a reflow process using a reflow furnace. As a result, the first and second connecting units are formed, and the first and second semiconductor chips 50 and 60 are mounted on the wafer 90, with voids being formed between the concave portions 52 and 62 and the first and second semiconductor chips 50 and 60 (FIG. 7E).

In joining the connecting units, it is also possible to use any of the following techniques: Au and Sn—Ag—Cu soldering; Au—Au joining through ultrasonic waves; joining through a reaction between conductive polymers and a metal; and thermal joining between metal layers on the cap unit and pads on MMIC chips.

Figure 8:
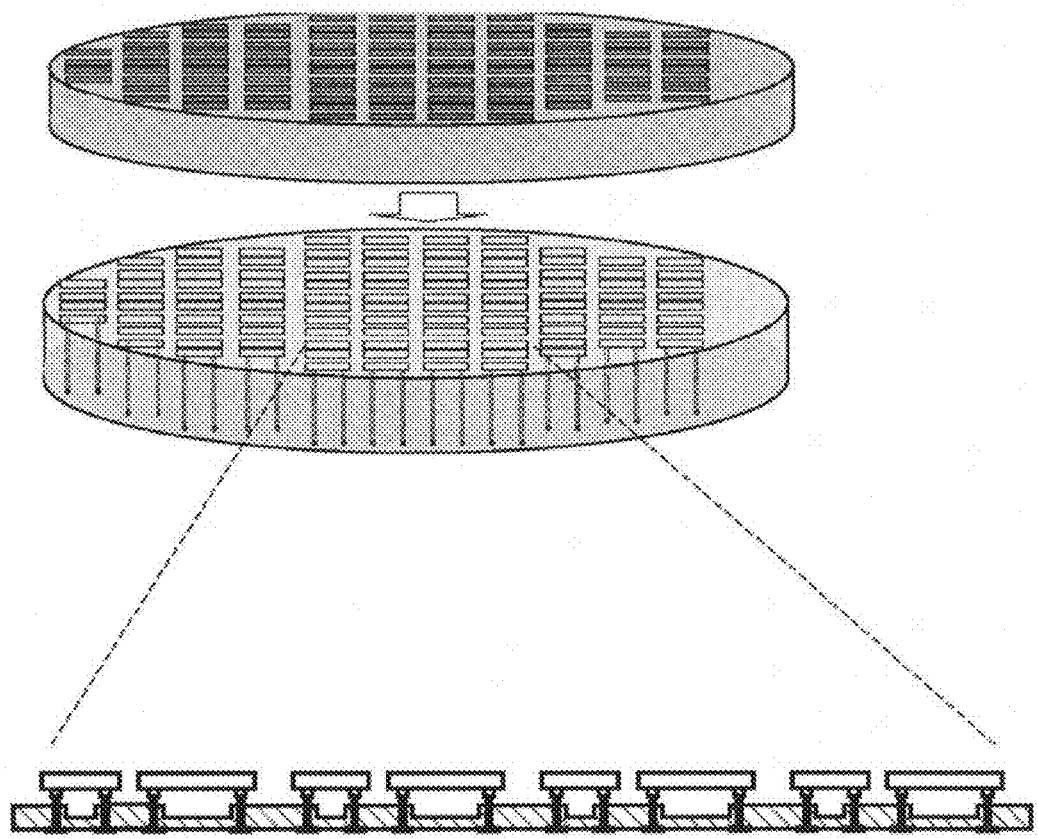
FIG. 8 is a wafer-level schematic view of a wafer and first and second semiconductor chips that are joined together.

FIG. 8 is a wafer-level schematic view of the wafer 90 and the first and second semiconductor chips 50 and 60 that are joined together. As in this embodiment, first and second semiconductor chips are mounted, at a wafer level, on a wafer having a concave portion formed therein, so that a cost reduction and higher efficiency in the semiconductor package manufacture can be achieved.

The wafer 90 is then diced to form a package including the first and second semiconductor chips 50 and 60. After that, the resin layer 72 reconstructs this package and/or another electronic component into a wafer form having a diameter of 3 inches, for example.

The resin of the resin layer 72 may be a low-k resin such as non-photosensitive epoxy resin, non-photosensitive polyimide resin, non-photosensitive fluorinated resin.

After that, the multi-interconnect layer 80 including the three insulating layers 82a, 82b, and 82c, and the interconnect layers 84a, 84b, and 84c is formed on the package through a known process. This multi-interconnect layer 80 is also called a reinterconnect layer.

EXAMPLES

In the following, examples are described.

Example 1

Figure 9:
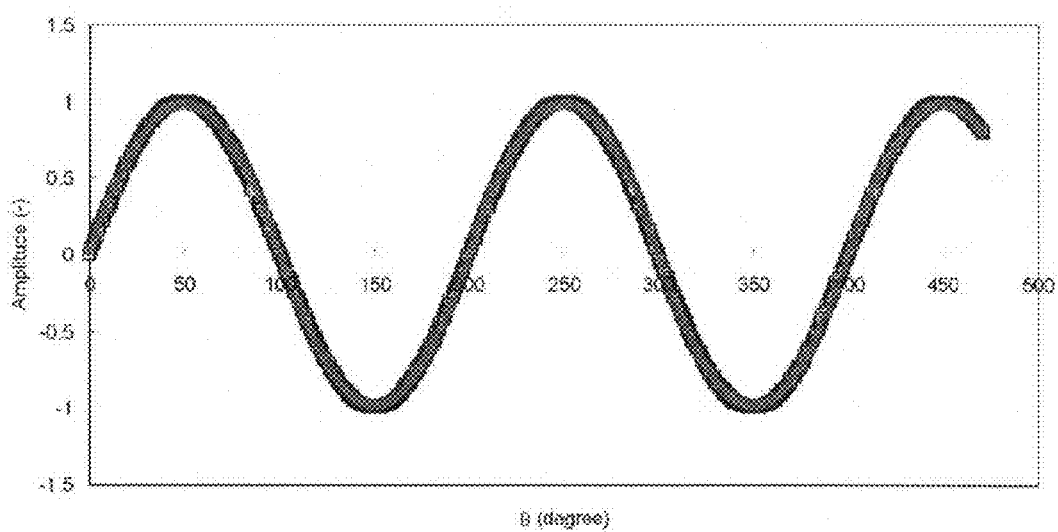
FIG. 9 shows the result of an evaluation of a semiconductor package of Example 1.

Example 1 is an example package structure of an MMIC chip that has a cap unit formed with high-resistance silicon and is compatible with X-band frequencies. The structure of the first embodiment shown in FIG. 1 was used. FIG. 9 is a graph showing the result of an evaluation on insertion loss of high-frequency signals between the input and output terminals of this embodiment. The graph indicates responses to input signals.

Distorted response waveforms as shown in FIG. 3 are not observed, and preferable responses are maintained in both the transmission system and the reception system.

Example 2

Figure 10:
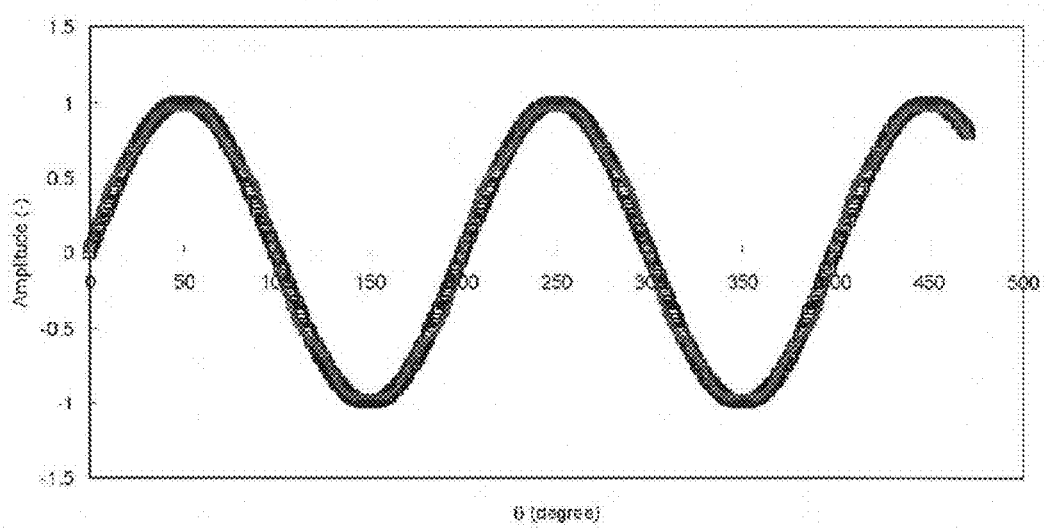
FIG. 10 shows the result of an evaluation of a semiconductor package of Example 2.

Example 2 is an example package structure of an MMIC chip that has a cap unit formed with high-resistance silicon and is compatible with X-band frequencies. The structure of the second embodiment shown in FIG. 4 was used. FIG. 10 is a graph showing the result of an evaluation on insertion loss of high-frequency signals between the input and output terminals of this embodiment. The graph indicates responses to input signals.

Distorted response waveforms as shown in FIG. 3 are not observed, and preferable responses are maintained in both the transmission system and the reception system.

Example 3

Figure 11:
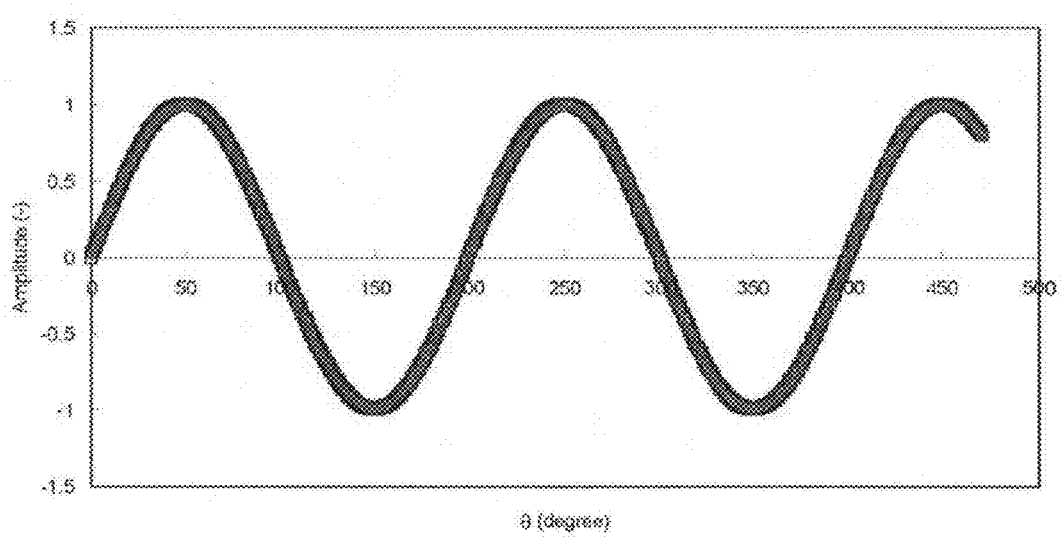
FIG. 11 shows the result of an evaluation of a semiconductor package of Example 3.

Example 3 is an example package structure of an MMIC chip that has a cap unit formed with high-resistance silicon and is compatible with X-band frequencies. The structure of the third embodiment shown in FIG. 5 was used. FIG. 11 is a graph showing the result of an evaluation on insertion loss of high-frequency signals between the input and output terminals of this embodiment. The graph indicates responses to input signals.

Distorted response waveforms as shown in FIG. 3 are not observed, and preferable responses are maintained in both the transmission system and the reception system.

Example 4

In Example 4, the degree of integration of the package manufactured in Example 1, 2, or 3 was further increased by using so-called pseudo SOC technology. The package and another electronic component such as an LCR were then formed into a one-chip module by using the reinterconnect layer described in the fourth embodiment. The manufacturing method is the same as that of the fourth embodiment.

Figure 12:
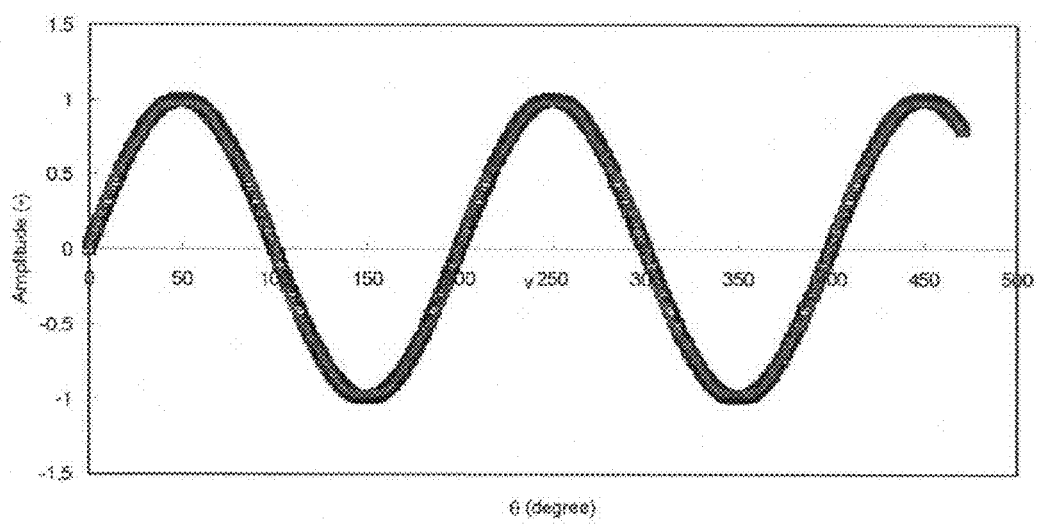
FIG. 12 shows the result of an evaluation of a semiconductor package of Example 4.

FIG. 12 is a graph showing the result of an evaluation on insertion loss of high-frequency signals between the input and output terminals of this embodiment. The graph indicates responses to input signals.

Distorted response waveforms as shown in FIG. 3 are not observed, and preferable responses are maintained in both the transmission system and the reception system.

Other than those described in the above embodiments and examples, there are many cap materials, plating materials, resin materials for sealing, resin materials for forming input/output interconnects, and metal materials for input/output interconnects. With a multilayer film, a conductive organic resin material, a functionally gradient material, and the like having different structures from those described above, it is also possible to form a module that satisfies the design requirements Each conductive film can be formed through a damascene process or the like through appropriate material selection. As the present invention has a wide range of application, the semiconductor chips can be used as semiconductor chips not only in high-frequency devices but also in logic devices, memory devices, power devices, optical devices, MEMS devices, sensor devices, and the like.

In the above described embodiments, silicon (Si) is the semiconductor material that is used as the material of the cap unit. However, the semiconductor material is not limited to silicon (Si), and it is possible to use some other single element semiconductor such as germanium (Ge), or a compound semiconductor such as silicon carbide (SiC), gallium nitride (GaN), or gallium arsenide (GaAs).

While certain embodiments have been described, these embodiments have been presented by way of example only, and are not intended to limit the scope of the inventions. Indeed, semiconductor packages and method of manufacturing the semiconductor packages described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor package comprising:
    a semiconductor chip having a signal input terminal and a signal output terminal; and
    a cap unit provided above the semiconductor chip, the cap unit including,
    a concave portion forming a hollow structure between the semiconductor chip and the cap unit, the concave portion having a first inner side surface and a second inner side surface facing each other, a first line of intersection between the first inner side surface and a plane parallel to a surface of the semiconductor chip and a second line of intersection between the second inner side surface and the plane are not parallel to each other,
    a first electrode electrically connected to the signal input terminal, one end of the first electrode exposed at a first surface of the cap unit and the other end of the first electrode exposed at a second surface of the cap unit opposite to the first surface, and
    a second electrode electrically connected to the signal output terminal, one end of the second electrode exposed at the first surface of the cap unit and the other end of the second electrode exposed at a third surface of the cap unit opposite to the first surface.

2. The package according to claim 1, wherein the first inner side surface and the second inner side surface are located in a direction of signal propagation in the semiconductor chip.

3. The package according to claim 1, wherein the first inner side surface has a first concave-convex pattern, and the second inner side surface has a second concave-convex pattern.

4. The package according to claim 3, wherein the first concave-convex pattern and the second concave-convex pattern differ from each other.

5. The package according to claim 3, wherein the first concave-convex pattern and the second concave-convex pattern do not have regularity.

6. The package according to claim 1, wherein at least part of the cap unit is made of silicon (Si).

7. The package according to claim 1, wherein at least part of the first and second electrodes is made of copper (Cu).

8. The package according to claim 1, wherein the semiconductor chip is an MMIC (Monolithic Microwave Integrated Circuit).

9. The package according to claim 1, further comprising:
    an insulating layer formed on the cap unit; and
    an interconnect layer formed on the insulating layer, the interconnect layer being electrically connected to one of the signal input terminal and the signal output terminal.

* * * * *